(12) United States Patent
Nozaki et al.

(10) Patent No.: US 12,362,525 B2
(45) Date of Patent: Jul. 15, 2025

(54) CONNECTION STRUCTURE FOR FLEXIBLE PRINTED BOARD AND METHOD FOR MANUFACTURING FLEXIBLE PRINTED BOARD UNIT

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Shinji Nozaki, Mie (JP); Kenji Makino, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 332 days.

(21) Appl. No.: 18/021,948

(22) PCT Filed: Jul. 30, 2021

(86) PCT No.: PCT/JP2021/028317
§ 371 (c)(1),
(2) Date: Feb. 17, 2023

(87) PCT Pub. No.: WO2022/049945
PCT Pub. Date: Mar. 10, 2022

(65) Prior Publication Data
US 2023/0361516 A1    Nov. 9, 2023

(30) Foreign Application Priority Data

Sep. 4, 2020    (JP) .................................. 2020-148914

(51) Int. Cl.
*H01R 24/60*    (2011.01)
*H01R 12/62*    (2011.01)
(Continued)

(52) U.S. Cl.
CPC ............. *H01R 24/60* (2013.01); *H01R 12/62* (2013.01); *H01R 12/778* (2013.01);
(Continued)

(58) Field of Classification Search
None
See application file for complete search history.

(56) References Cited

U.S. PATENT DOCUMENTS 3,158,421 A * 11/1964 Hasenauer, Jr. ....... H01R 12/79
                                                             439/493
5,040,997 A * 8/1991 Garner ................... H01R 12/78
                                                             439/329

(Continued)

FOREIGN PATENT DOCUMENTS

JP    H09-312183 A    12/1997

OTHER PUBLICATIONS

International Search Report issued on Oct. 5, 2021 for WO 2022/049945 A1 (4 pages).

*Primary Examiner* — Oscar C Jimenez
(74) *Attorney, Agent, or Firm* — Venjuris, P.C.

(57) ABSTRACT

It is aimed to provide a connection structure for flexible printed board and a method for manufacturing a flexible printed board unit, which are hardly affected by dimensional tolerances between adjacent contacts and capable of preventing a size increase. A flexible printed board includes a first constituent portion having a plurality of first contacts arrayed along a lateral direction provided on a front surface and a second constituent portion disposed side by side with the first constituent portion in a front-rear direction and (Continued)

having a plurality of second contacts arrayed along the lateral direction provided on a front surface. A supporting portion supports the flexible printed board in a folded state such that a back surface of the first constituent portion and a back surface of the second constituent portion face each other. The first contacts and the second contacts are arranged in a staggered manner along the lateral direction.

5 Claims, 13 Drawing Sheets

(51) Int. Cl.
*H01R 12/77* (2011.01)
*H01R 43/20* (2006.01)
*H05K 1/11* (2006.01)

(52) U.S. Cl.
CPC ........... *H01R 43/205* (2013.01); *H05K 1/118* (2013.01); *H05K 2201/056* (2013.01); *H05K 2201/09445* (2013.01)

(56) References Cited

U.S. PATENT DOCUMENTS

| | | | |
|---|---|---|---|
| 5,044,980 A * | 9/1991 | Krumme | H01R 12/82 439/433 |
| 5,123,852 A | 6/1992 | Gillett | |
| 5,507,651 A | 4/1996 | Tanaka et al. | |
| 6,053,751 A | 4/2000 | Humphrey | |
| 9,812,801 B2 * | 11/2017 | Okura | H01B 7/08 |
| 2016/0204533 A1 | 7/2016 | Ogino | |
| 2019/0045633 A1 * | 2/2019 | Chuo | H05K 1/0393 |

* cited by examiner

CONNECTION STRUCTURE FOR FLEXIBLE PRINTED BOARD AND METHOD FOR MANUFACTURING FLEXIBLE PRINTED BOARD UNIT

CROSS REFERENCE TO RELATED APPLICATIONS

This application is a national phase of PCT application No. PCT/JP2021/028317, filed on 30 Jul. 2021, which claims priority from Japanese patent application No. 2020-148914, filed on 4 Sep. 2020, all of which are incorporated herein by reference.

TECHNICAL FIELD

The present disclosure relates to a connection structure for flexible printed board and a method for manufacturing a flexible printed board unit.

BACKGROUND

Patent Document 1 discloses a connection structure for signal transmission medium (FPC, FFC, etc.) to an electrical connector to be mounted on a printed wiring board. The electrical connector is provided with an insulating housing, an actuator and a plurality of contact members. The insulating housing is in the form of an elongated hollow frame body. The actuator is attached to a front end edge part of the insulating housing. The actuator rotates to be pushed and tilted toward a connector front end side, into which an end part of a signal transmission medium is inserted. Contact point portions of the plurality of contact members are arrayed to form multiple poles in the insulating housing. If the actuator is rotated to an operating position (closed position), each wiring pattern of the signal transmission medium is connected to each contact point portion of the electrical connector.

PRIOR ART DOCUMENT

Patent Document

Patent Document 1: JP 2016-129124 A

SUMMARY OF THE INVENTION

Problem to be Solved

In the connection structure for signal transmission medium of patent literature 1, the respective contact point portions of the plurality of contact members are arrayed along a longitudinal direction of the insulating housing. Thus, to provide more contact members, it is considered to add contact members along the longitudinal direction of the insulating housing. In this case, a longitudinal size of the insulating housing becomes large.

The present disclosure was completed on the basis of the above situation and aims to provide a connection structure for flexible printed board and a method for manufacturing a flexible printed board unit, which are hardly affected by dimensional tolerances between adjacent contacts and capable of preventing a size increase.

Means to Solve the Problem

The present disclosure is directed to a connection structure for flexible printed board in which a flexible printed board is connected to a mating connector, the connection structure including the flexible printed board including a first constituent portion having a plurality of first contacts arrayed along a predetermined first direction provided on a front surface and a second constituent portion disposed side by side with the first constituent portion in a second direction orthogonal to the first direction, the second constituent portion having a plurality of second contacts arrayed along the first direction provided on a front surface, and a supporting portion for supporting the flexible printed board in a folded state such that a back surface of the first constituent portion and a back surface of the second constituent portion face each other, the plurality of first contacts and the plurality of second contacts being arranged in a staggered manner along the first direction, and the mating connector including a plurality of terminal fittings arrayed along the first direction, the terminal fitting sandwiching the first and second constituent portions from both sides in the second direction and contacting either one of the first and second contacts.

The present disclosure is directed to a method for manufacturing a flexible printed board unit including a flexible printed board to be connected to a mating connector and a supporting portion for supporting the flexible printed board, the flexible printed board including a first constituent portion having a plurality of first contacts arrayed along a predetermined first direction provided on a front surface and a second constituent portion disposed side by side with the first constituent portion in a second direction orthogonal to the first direction, the second constituent portion having second contacts arrayed along the first direction provided on a front surface, the supporting portion including a first fixing portion to be planarly fixed to a back surface of the first constituent portion and a second fixing portion separate from the first fixing portion and to be planarly fixed to a back surface of the second constituent portion, the method including connecting the first fixing portion to the back surface of the first constituent portion by reflow solder such that the first constituent portion is planar and connecting the second fixing portion to the back surface of the second constituent portion by reflow solder such that the second constituent portion is planar for the planar flexible printed board, and folding the flexible printed board after a reflow process by bringing the first and second fixing portions closer such that the back surface of the first constituent portion and the back surface of the second constituent portion face each other.

DETAILED DESCRIPTION TO EXECUTE THE INVENTION

Description of Embodiments of Present Disclosure

Figure 1:
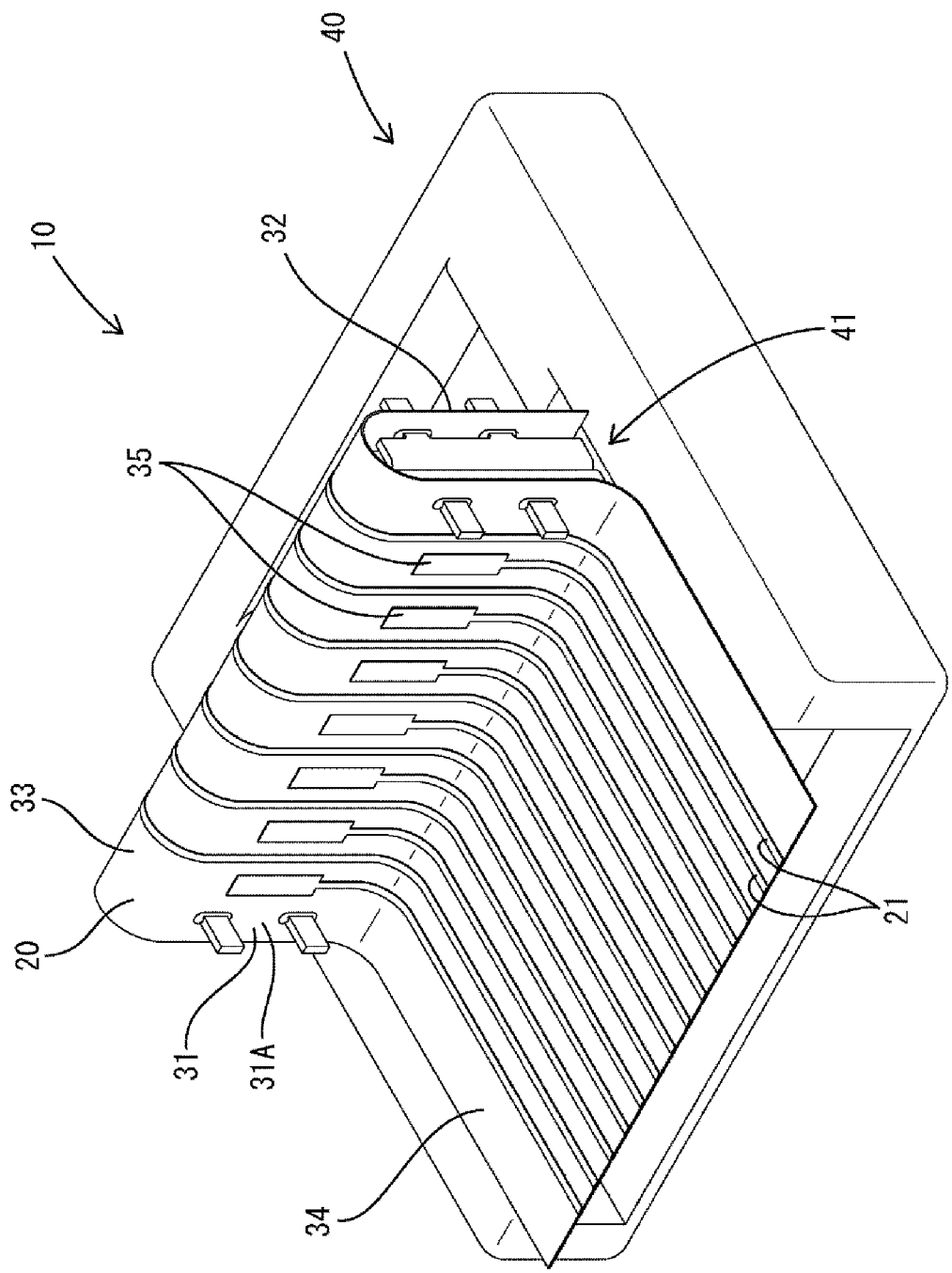
FIG. 1 is a perspective view of a first connector of one embodiment.

First, embodiments of the present disclosure are listed and described.

(1) The connection structure for flexible printed board of the present disclosure is a connection structure for flexible printed board in which a flexible printed board is connected to a mating connector, the connection structure including the flexible printed board including a first constituent portion having a plurality of first contacts arrayed along a predetermined first direction provided on a front surface and a second constituent portion disposed side by side with the first constituent portion in a second direction orthogonal to the first direction, the second constituent portion having a plurality of second contacts arrayed along the first direction provided on a front surface, and a supporting portion for supporting the flexible printed board in a folded state such that a back surface of the first constituent portion and a back surface of the second constituent portion face each other, the plurality of first contacts and the plurality of second contacts being arranged in a staggered manner along the first direction, and the mating connector including a plurality of terminal fittings arrayed along the first direction, the terminal fitting sandwiching the first and second constituent portions from both sides in the second direction and contacting either one of the first and second contacts.

The first constituent portion having the plurality of first contacts arrayed along the first direction provided on the front surface and the second constituent portion having the plurality of second contacts arrayed along the first direction provided on the front surface are disposed side by side in the second direction orthogonal to the first direction. Thus, a size of the flexible printed board in the first direction can be reduced as compared to a configuration in which as many contacts as the sum of the first and second contacts are arrayed along the first direction. Since the back surface of the first constituent portion and that of the second constituent portion face each other, a size of the flexible printed board in the second direction can be reduced as compared to a configuration in which the first and second constituent portions are planar along the second direction. Since the plurality of first contacts and the plurality of second contacts are arranged in a staggered manner along the first direction, intervals between the contacts adjacent in the first direction are set relatively wide and there is little influence of dimensional tolerances.

(2) Preferably, the supporting portion includes a fixing portion to be planarly fixed to the back surface of the first constituent portion and the back surface of the second constituent portion.

According to this configuration, the first and second constituent portions can be smoothly sandwiched by the terminal fittings as compared to a configuration in which the back surface of the first constituent portion or that of the second constituent portion has a curved shape or the like.

(3) Preferably, the fixing portion includes a first fixing portion to be planarly fixed to the back surface of the first constituent portion, and a second fixing portion separate from the first fixing portion and to be planarly fixed to the back surface of the second constituent portion.

According to this configuration, the first fixing portion to be planarly fixed to the back surface of the first constituent portion and the second fixing portion to be planarly fixed to the back surface of the second constituent portion can be arranged on the same two-dimensional plane. Thus, a reflow process can be performed for the planarly arranged first and second fixing portions, and the first and second fixing portions are more easily fixed to the flexible printed board.

(4) Preferably, the first fixing portion is fixed to the back surface of the first constituent portion by soldering, and the second fixing portion is fixed to the back surface of the second constituent portion by soldering.

According to this configuration, the back surface of the first constituent portion and that of the second constituent portion are respectively more easily planarly fixed to the first and second fixing portions.

The method for manufacturing a flexible printed board unit of the present disclosure is a method for manufacturing a flexible printed board unit including a flexible printed board to be connected to a mating connector and a supporting portion for supporting the flexible printed board, the flexible printed board including a first constituent portion having a plurality of first contacts arrayed along a predetermined first direction provided on a front surface and a second constituent portion disposed side by side with the first constituent portion in a second direction orthogonal to the first direction, the second constituent portion having a plurality of second contacts arrayed along the first direction provided on a front surface, the supporting portion including a first fixing portion to be planarly fixed to a back surface of the first constituent portion and a second fixing portion separate from the first fixing portion and to be planarly fixed to a back surface of the second constituent portion, the method including connecting the first fixing portion to the back surface of the first constituent portion by reflow solder such that the first constituent portion is planar and connecting the second fixing portion to the back surface of the second constituent portion by reflow solder such that the second constituent portion is planar for the planar flexible printed board, and folding the flexible printed board after a reflow process by bringing the first and second fixing portions closer such that the back surface of the first constituent portion and the back surface of the second constituent portion face each other.

According to this configuration, for the planar flexible printed board, the first fixing portion to be planarly fixed to the back surface of the first constituent portion and the second fixing portion to be planarly fixed to the back surface of the second constituent portion can be arranged on the same two-dimensional plane. Thus, a reflow process can be performed for the planarly arranged first and second fixing portions, and the first and second fixing portions are more easily fixed to the flexible printed board. By bringing the first and second fixing portions closer after the reflow process such that the back surface of the first constituent portion and that of the second constituent portion face each other, the flexible printed board can be easily folded.

Effects similar to those described in (1) above are achieved also for the method for manufacturing a flexible printed board unit of the present disclosure.

DETAILS OF EMBODIMENT OF PRESENT DISCLOSURE

Embodiment

A specific embodiment of a connection structure for flexible printed board of the present disclosure is described below with reference to FIGS. 1 to 13. In this embodiment, upper and lower sides shown in FIGS. 1, 2, 6 to 8, 12 and 13 are directly defined as upper and lower sides concerning a vertical direction. Left and right sides shown in FIGS. 1 to 13 are respectively defined as front and rear sides concerning a front-rear direction. A lateral direction is synonymous with a width direction, and front and rear sides shown in FIGS. 1, 2, 4 and 6 to 13 are defined as right and left sides.

Figure 5:
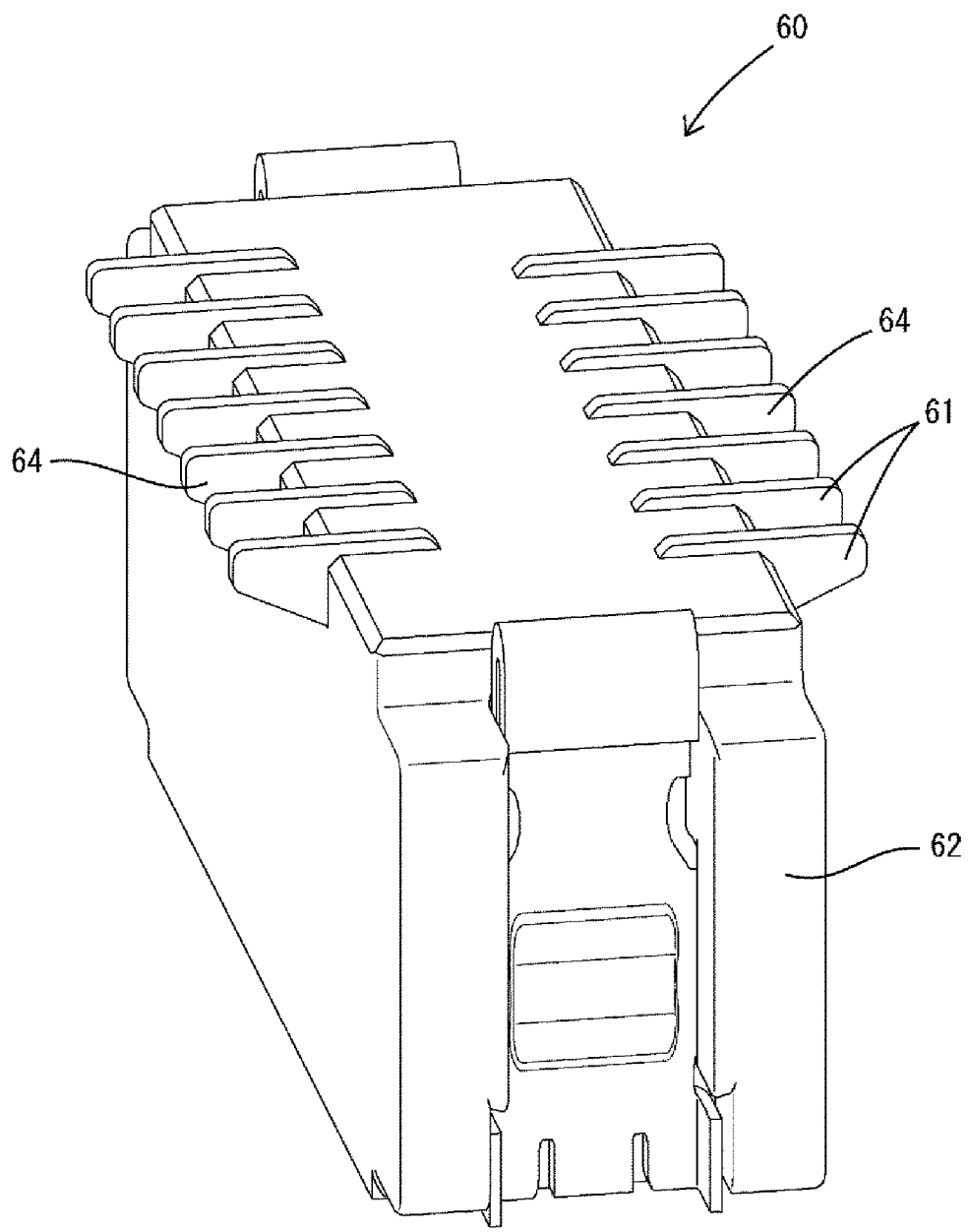
FIG. 5 is a perspective view of a second connector viewed from above.
Figure 12:
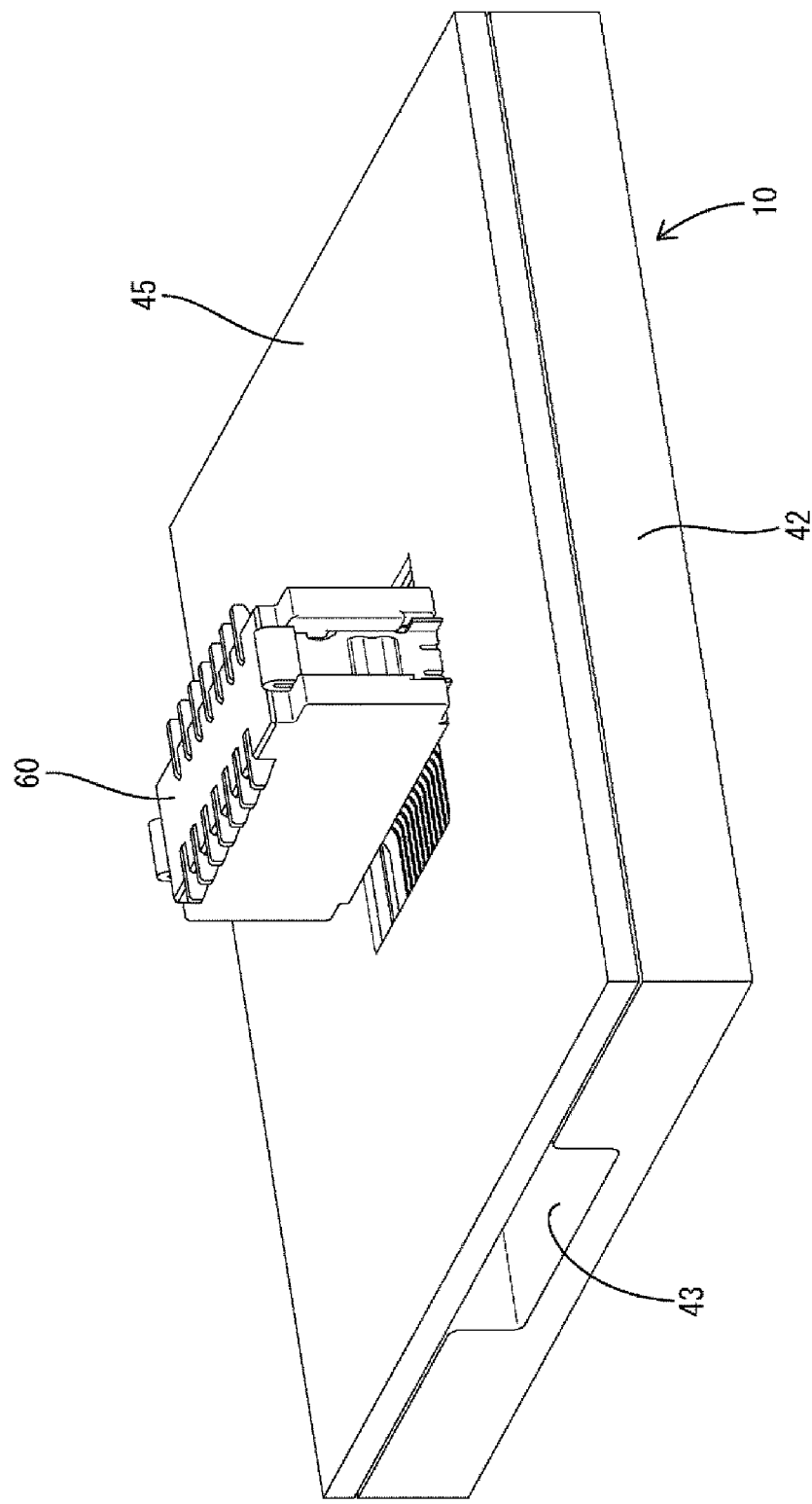
FIG. 12 is a perspective view showing a state where the first connector is assembled with the second connector.

The connection structure for flexible printed board of this embodiment is composed of a first connector 10 (flexible printed board unit) shown in FIG. 1 and a second connector (mating connector) 60 shown in FIG. 5. The first connector 10 is assembled with the second connector 60 as shown in FIG. 12.

<First Connector>

Figure 2:
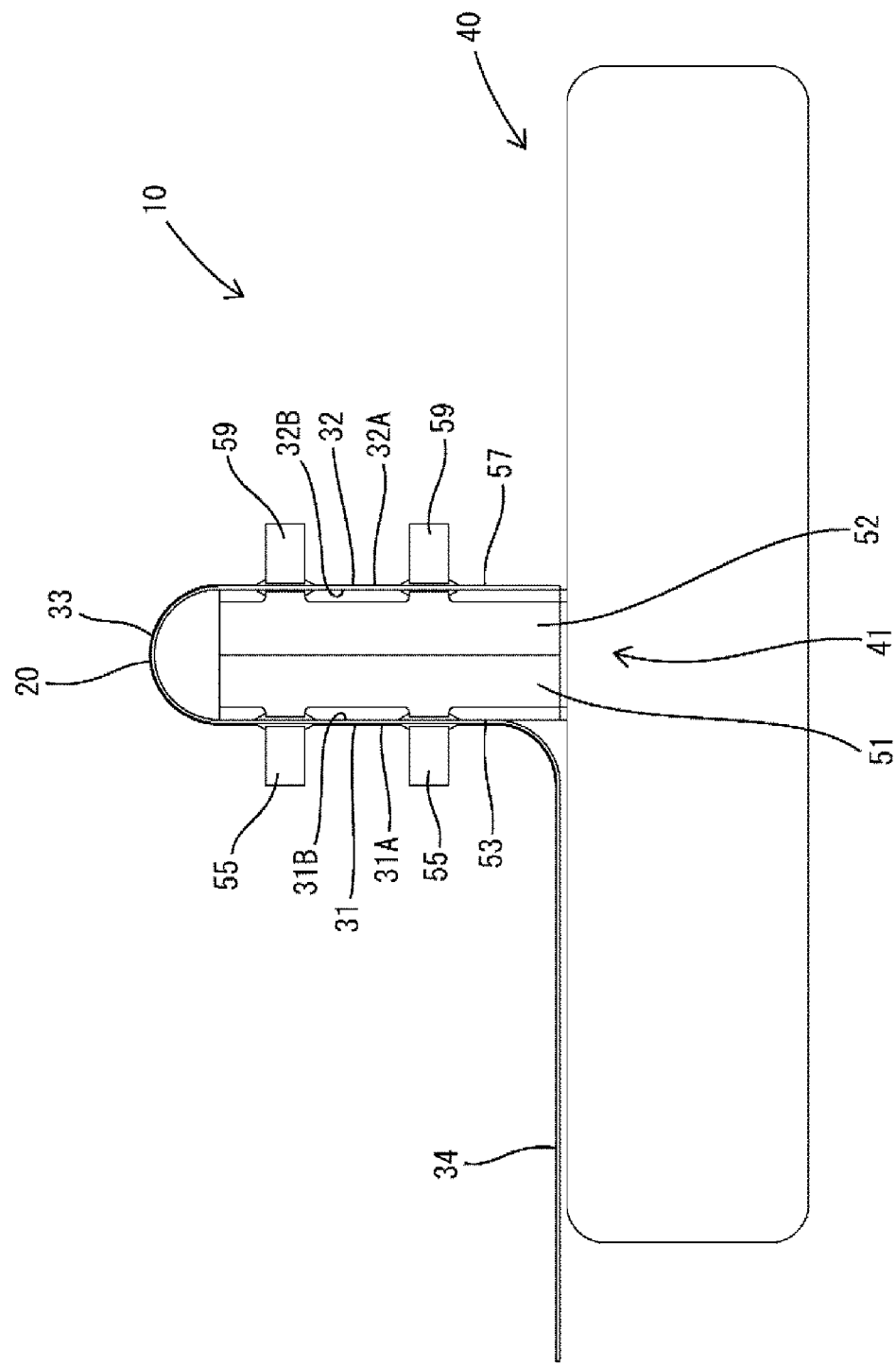
FIG. 2 is a side view of the first connector.
Figure 4:
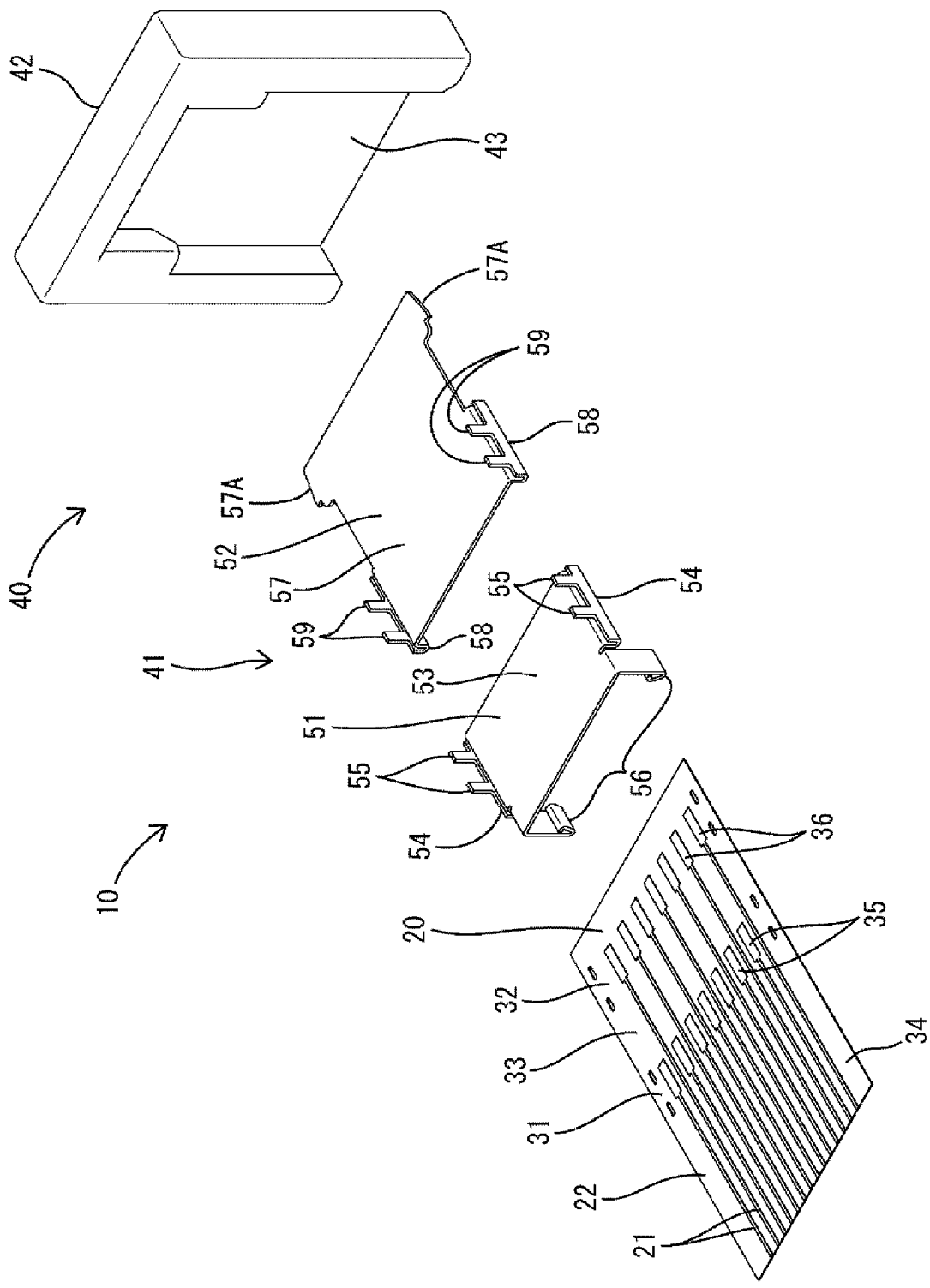
FIG. 4 is an exploded perspective view of the first connector.

As shown in FIGS. 1 and 2, the first connector 10 is provided with a flexible printed board 20 and a supporting portion 40. The flexible printed board 20 is supported in a folded state by the supporting portion 40. As shown in FIG. 4, the flexible printed board 20 includes a plurality of strip-like wires 21 and an insulating sheet 22 for covering the respective wires 21. The wires 21 are formed, for example, by gold plating. The wires 21 are arranged in parallel at certain intervals. The insulating sheet 22 is a sheet made of insulating resin. The wires 21 are covered by the insulating sheet 22.

As shown in FIGS. 1 and 2, the flexible printed board 20 includes a first constituent portion 31, a second constituent portion 32, a bent portion 33 and a body portion 34. The first constituent portion 31, the second constituent portion 32 and the bent portion 33 constitute an end part of the strip-like flexible printed board 20. In the flexible printed board 20, the first constituent portion 31, the bent portion 33 and the second constituent portion 32 are arranged in this order from the body portion 34 toward an end.

As shown in FIGS. 1 and 2, the first constituent portion 31 is in the form of a flat plate. The first constituent portion 31 extends upward from an end part of the body portion 34. A plate surface of the first constituent portion 31 is orthogonal to that of the body portion 34. A connected part of the first constituent portion 31 and the body portion 34 is curved.

Figure 3:
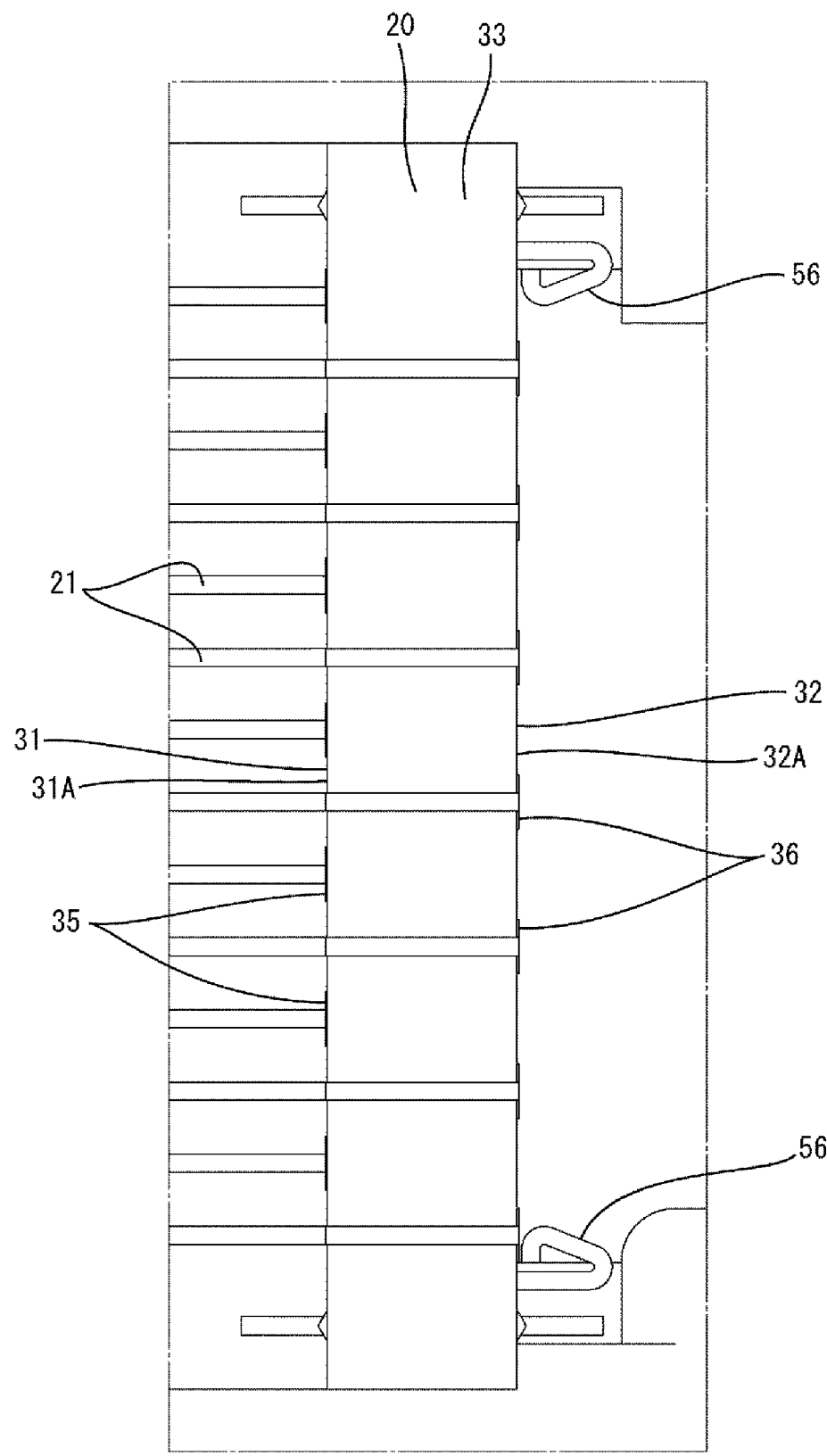
FIG. 3 is a plan view of the first connector.

As shown in FIGS. 1 and 3, a plurality of first contacts 35 arrayed at equal intervals along a predetermined first direction (lateral direction) are provided on a front surface (upper surface) 31A of the first constituent portion 31. The first direction is a transverse direction of the insulating sheet 22. The first contacts 35 have a rectangular shape. The first contacts 35 are provided on end parts of the wires 21. A width of the first contact 35 is larger than that of the wire 21. The first contacts 35 are exposed without being covered by the insulating sheet 22.

As shown in FIGS. 1 and 2, the second constituent portion 32 is in the form of a flat plate. The second constituent portion 32 extends downward from an end part (end part on a side opposite to the first constituent portion 31) of the bent portion 33 to be described later. A plate surface of the second constituent portion 32 is orthogonal to that of the body portion 34.

As shown in FIG. 3, a plurality of second contacts 36 arrayed at equal intervals along the first direction (lateral direction) are provided on a front surface (upper surface) 32A of the second constituent portion 32. The second contacts 36 have a rectangular shape. The second contacts 36 are provided on end parts of the wires 21. Parts of the wires 21 leading to the second contacts 36 are also included in the first constituent portion 31 and the bent portion 33. A width of the second contact 36 is equal to that of the first contact 35. That is, the width of the second contact 36 is larger than that of the wire 21. The second contacts 36 are exposed without being covered by the insulating sheet 22.

As shown in FIGS. 1 and 2, the bent portion 33 couples the first and second constituent portions 31, 32. The bent portion 33 is folded and bent to be convex upward.

As shown in FIG. 4, the plurality of first contacts 35 and the plurality of second contacts 36 are arranged in a staggered manner along the lateral direction in the flexible printed board 20 in a state before being folded (planar state). A lateral row of the plurality of first contacts 35 and that of the plurality of second contacts 36 are shifted in the front-rear direction.

As shown in FIG. 2, the supporting portion 40 supports the flexible printed board 20 in a folded state such that a back surface 31B of the first constituent portion 31 and a back surface 32B of the second constituent portion 32 face each other. As shown in FIG. 4, the supporting portion 40 includes a fixing portion 41 and a holding portion 42.

As shown in FIG. 2, the back surface (lower surface) 31B of the first constituent portion 31 and the back surface (lower surface) 32B of the second constituent portion 32 are planarly fixed to the fixing portion 41. The fixing portion 41 includes a first fixing portion 51 and a second fixing portion 52. The first and second fixing portion 51, 52 are separate bodies. The first and second fixing portions 51, 52 are, for example, made of metal. As shown in FIG. 4, the first fixing portion 51 includes a plate portion 53, a pair of folded portions 54, four protrusions 55 and a pair of hooking portions 56. The plate portion 53 has a rectangular shape long in the lateral direction. The folded portions 54 are provided on parts of left and right edge parts of the plate portion 53 excluding the hooking portions 56 to be described later. The folded portion 54 is folded into a U shape to be convex downward when viewed from the front-rear direction. A pair of the protrusions 55 are in the form of strip plates projecting upward from the tip of the folded portion 54 (end part on a side opposite to the plate portion 53). The pair of hooking portions 56 project downward from the front ends of the respective left and right edge parts of the plate portion 53. The hooking portion 56 is in the form of a strip plate having a tip folded inwardly into a hook shape.

The first fixing portion 51 is fixed to the back surface (lower surface) 31B of the first constituent portion 31 by soldering. As shown in FIG. 2, the back surface (lower surface) 31B of the first constituent portion 31 is planarly fixed to the first fixing portion 51. The upper surface (left side surface in FIG. 2) of the plate portion 53 is covered by the back surface (lower surface) 31B of the first constituent portion 31. The upper surface of the plate portion 53 is in contact with the back surface (lower surface) 31B of the first constituent portion 31. The protrusions 55 are inserted through holes (not shown) provided in the constituent portion 31 and solder-connected. By using solder for the connection of the first constituent portion 31 and the first fixing portion 51, the back surface 31B of the first constituent portion 31 is more easily planarly fixed to the first fixing portion 51.

Figure 11:
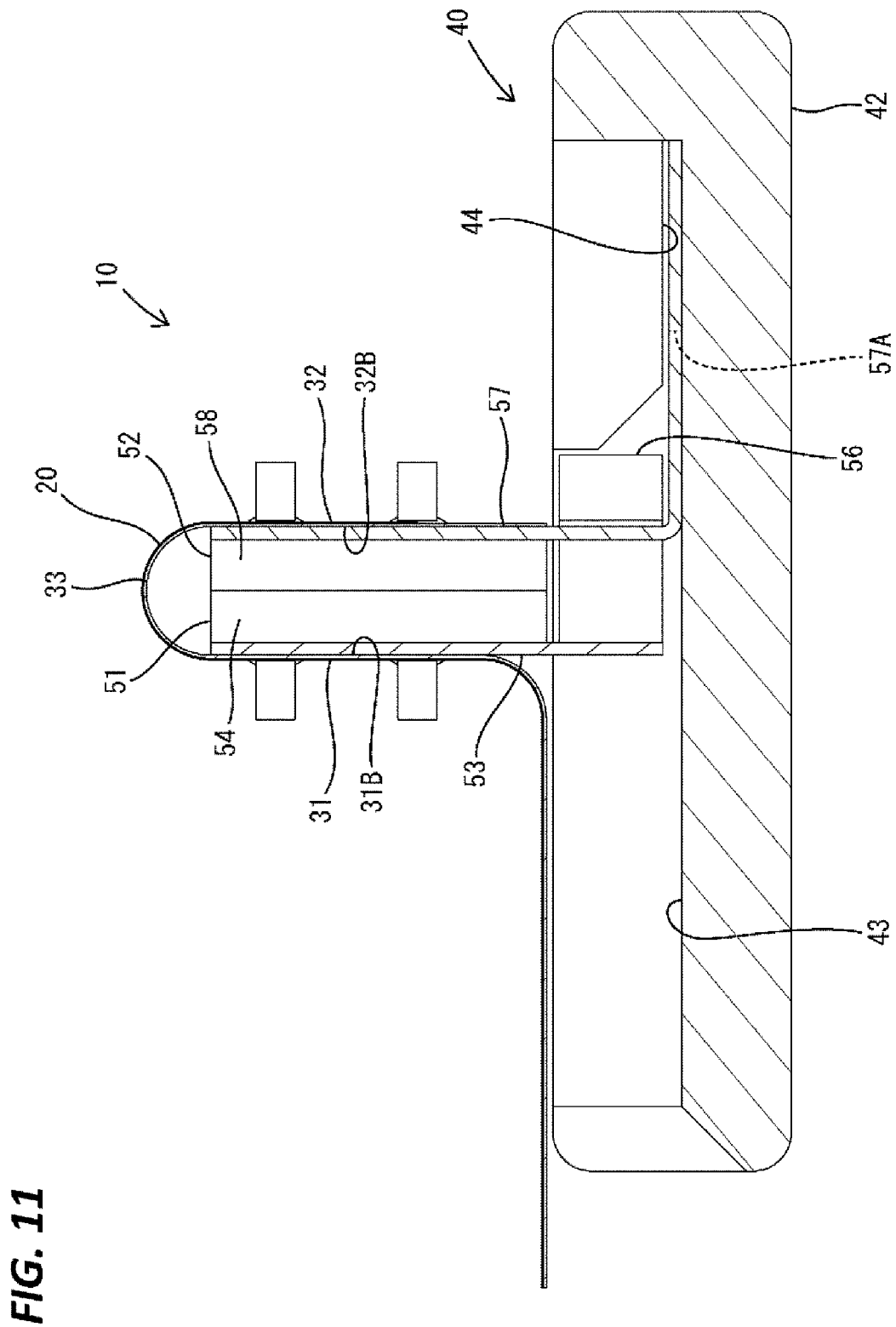
FIG. 11 is a section of the first connector fabricated by bending the flexible printed board in the state shown in FIGS. 9 and 10.

As shown in FIG. 4, the second fixing portion 52 includes a plate portion 57, a pair of folded portions 58 and four protrusions 59. The plate portion 57 has a rectangular shape long in the lateral direction. As shown in FIG. 11, the plate portion 57 is folded into an L shape when viewed from the lateral direction. A pair of extending portions 57A respectively extending on both left and right sides are provided on the rear end of the plate portion 57. A rear end side (part orthogonal to a front end side) of the plate portion 57 is fixed to the holding portion 42 to be described later. The folded portions 58 are provided on left and right edge parts of the plate portion 57 as shown in FIG. 4. The folded portion 58 is folded into a U shape to be convex downward when viewed from the front-rear direction. A pair of the protrusions 59 are in the form of strip plates projecting upward from the tip (end part on a side opposite to the plate portion 57) of the folded portion 58.

The second fixing portion 52 is fixed to the back surface (lower surface) 32B of the second constituent portion 32 by soldering. As shown in FIG. 2, the back surface (lower surface) 32B of the second constituent portion 32 is planarly fixed to the second fixing portion 52. The upper surface (right side surface in FIG. 2) of the plate portion 57 is covered by the back surface (lower surface) 32B of the second constituent portion 32. The upper surface of the plate portion 57 is in contact with the back surface (lower surface) 32B of the second constituent portion 32. The protrusions 59 are inserted through holes (not shown) provided near end parts in the lateral direction of the second constituent portion 32 and solder-connected. By using solder for the connection of the second constituent portion 32 and the second fixing portion 52, the back surface 32B of the second constituent portion 32 is more easily planarly fixed to the second fixing portion 52.

Figure 9:
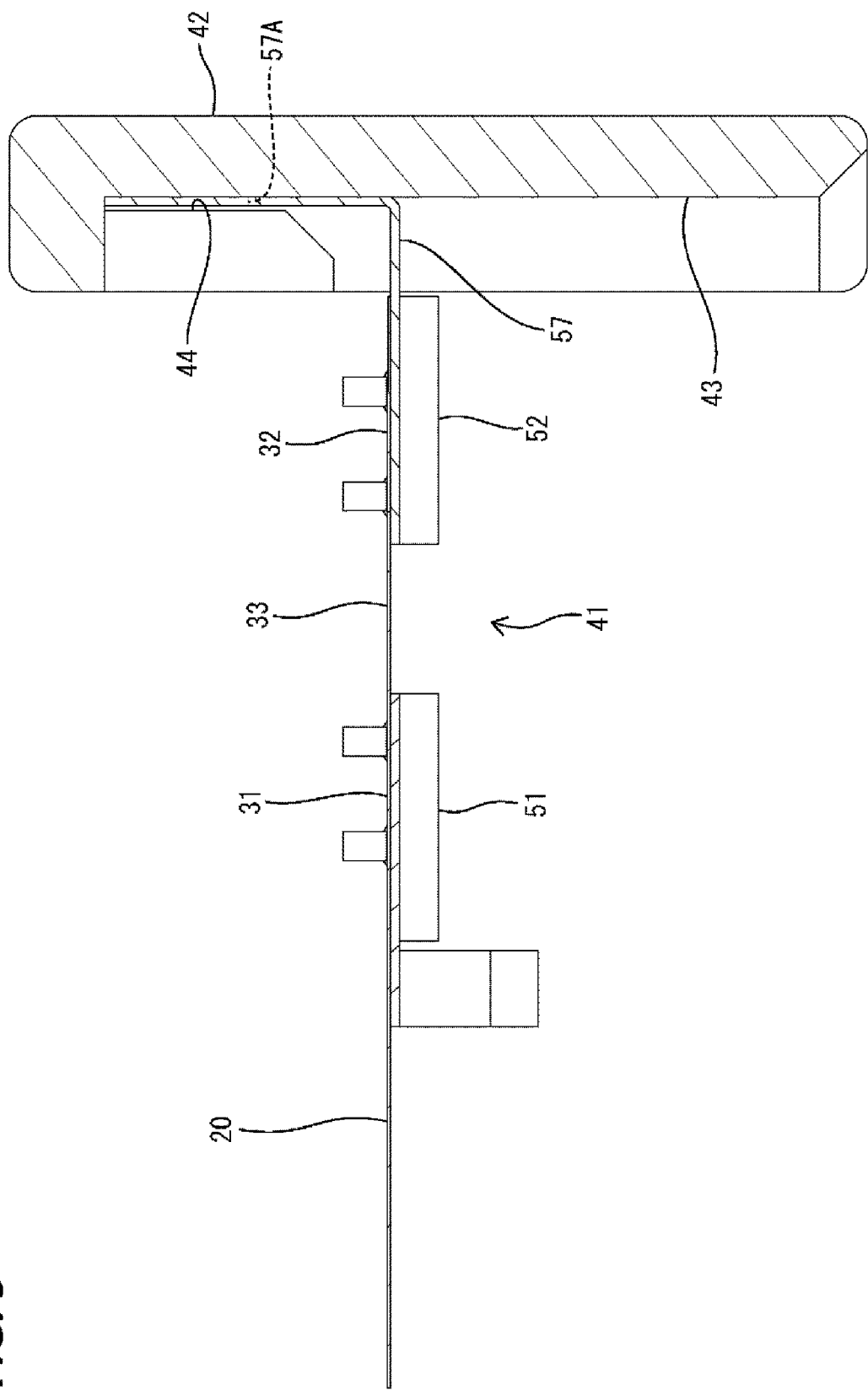
FIG. 9 is a section showing a state where a holding portion is attached to the flexible printed board in the state shown in FIG. 8.

The holding portion 42 shown in FIG. 4 is a member for supporting the fixing portion 41. The holding portion 42 is, for example, made of resin. The holding portion 42 has a rectangular parallelepiped shape. The holding portion 42 is provided with a groove portion 43 open forward and upward. A rear end part of the plate portion 57 is fixed in a bottom part of the groove portion 43. Slits 44 (see FIG. 9) respectively extending along the front-rear direction are provided in both left and right ends of the bottom part of the groove portion 43. As shown in FIG. 9, the second fixing portion 52 is fixed to the holding portion 42 by inserting the extending portions 57A into the slits 44.

As shown in FIG. 2, the supporting portion 40 supports the flexible printed board 20 in the folded state such that the back surface 31B of the first constituent portion 31 and the back surface 32B of the second constituent portion 32 face each other. The back surface 31B of the first constituent portion 31 and the back surface 32B of the second constituent portion 32 are in contact with the fixing portion 41. The folded portions 54, 58 are in contact along the vertical direction. The hooking portions 56 of the first constituent portion 31 are hooked to end parts in the lateral direction of the plate portion 57 of the second constituent portion 32 as shown in FIGS. 3 and 11. In this way, a facing state of the back surface 31B of the first constituent portion 31 and the back surface 32B of the second constituent portion 32 is maintained. As shown in FIG. 2, a plate surface of the plate portion 53 of the first constituent portion 31 and that of the plate portion 57 of the second constituent portion 32 are parallel. The front surface 31A of the first constituent portion 31 and the front surface 32A of the second constituent portion 32 are parallel.

As shown in FIG. 3, the plurality of first contacts 35 and the plurality of second contacts 36 are arranged in a staggered manner while being alternately arranged in the lateral direction and separated in the front-rear direction in the folded state of the flexible printed board 20. The row of the plurality of first contacts 35 and that of the plurality of second contacts 36 are shifted in the front-rear direction. When only the first and second contacts 35, 36 are viewed from the front-rear direction, the second contacts 36 are located at center positions (half-pitch positions) between the first contacts 35. The plurality of first contacts 35 and the plurality of second contacts 36 are arranged at equal intervals in a row in the lateral direction.

In the first connector 10, a size of the flexible printed board 20 in the lateral direction can be reduced by the staggered arrangement of the contacts as compared to a configuration in which the same number of contacts (as many contacts as the sum of the first and second contacts 35, 36) are arrayed along the lateral direction. Since the first connector 10 is configured such that the back surface 31B of the first constituent portion 31 and the back surface 32B of the second constituent portion 32 face each other, a size of the flexible printed board 20 in the front-rear direction can be reduced as compared to a configuration in which the first and second constituent portions 31, 32 are planar along the front-rear direction. In the first connector 10, by the above staggered arrangement of the contacts, intervals between the contacts adjacent in the lateral direction (between the adjacent first contacts 35, between the adjacent second contacts 36) are relatively widely set and there is little influence of dimensional tolerances of the respective contacts.

<Second Connector>

Figure 6:
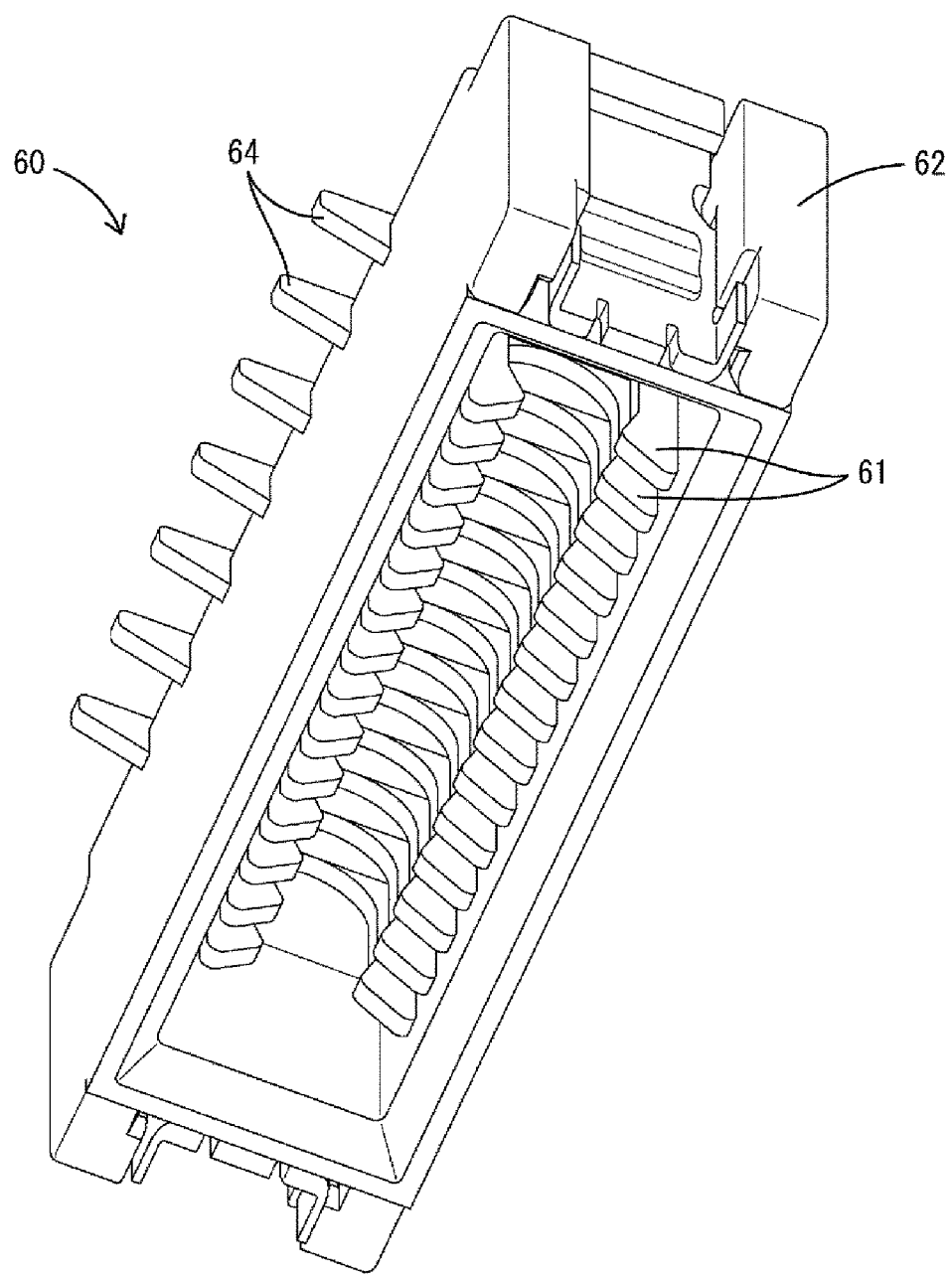
FIG. 6 is a perspective view of the second connector viewed from below.
Figure 7:
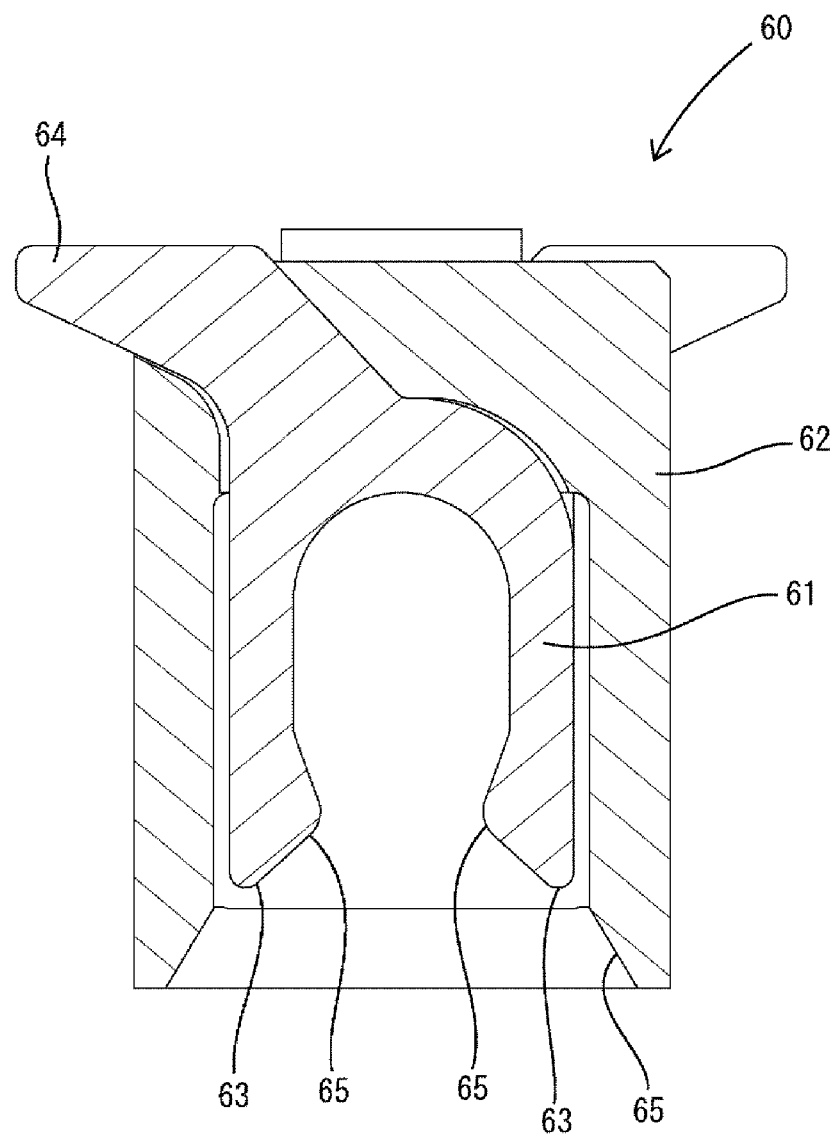
FIG. 7 is a section of the second connector.

As shown in FIGS. 5 and 6, the second connector 60 includes a plurality of terminal fittings 61 and a case 62. As shown in FIG. 7, the terminal fitting 61 is a tuning fork-shaped plate-like terminal. The terminal fitting 61 includes a pair of sandwiching pieces 63 and a connecting piece 64. The pair of sandwiching pieces 63 project downward in parallel. A third contact 65 projecting inward (toward the other sandwiching piece 63) is provided on the tip of the sandwiching piece 63. The connecting piece 64 projects in a direction orthogonal to a projecting direction of the sandwiching pieces 63 on base end sides of the pair of sandwiching pieces 63. The connecting piece 64 is exposed from the upper end of the case 62. Wiring or the like is, for example, connected to the connecting piece 64.

As shown in FIG. 6, the case 62 is open downward. The front and rear lower ends of the case 62 are tapered to be inclined upward an inner side as shown in FIG. 7. The case 62 holds the plurality of terminal fittings 61. The plurality of terminal fittings 61 are arranged at equal intervals in a plate thickness direction. Projecting directions of the connecting pieces 64 are opposite between adjacent ones of the terminal fittings 61. When viewed from the vertical direction, the connecting pieces 64 of the plurality of terminal fittings 61 are arranged in a staggered manner (see FIG. 5) along the lateral direction. A row of the connecting pieces 64 projecting forward and that of the connecting pieces 64 projecting rearward are shifted in the lateral direction. If only the terminal fittings 61 are viewed from the front-rear direction, the connecting pieces 64 projecting rearward are located at center positions (half-pitch positions) between the connecting pieces 64 projecting forward. The connecting pieces 64 projecting forward and those projecting rearward are arranged at equal intervals in a row in the lateral direction. Each terminal fitting 61 contacts either one of the first and second contacts 35, 36.

<Manufacturing Method of First Connector>

Figure 8:
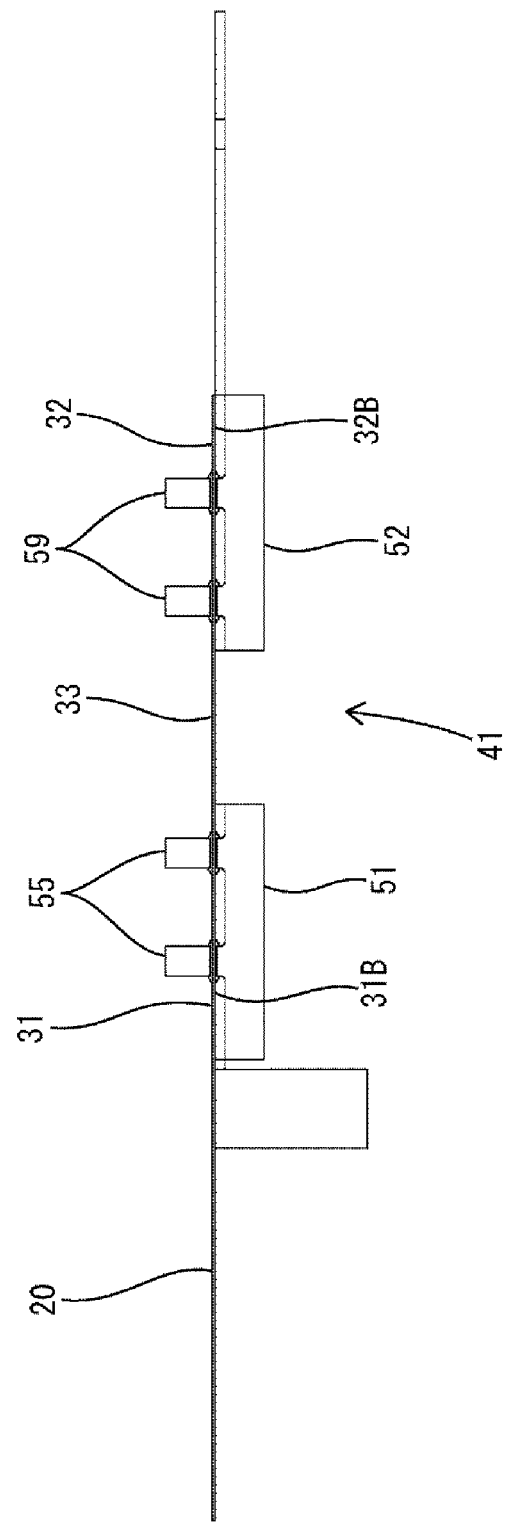
FIG. 8 is a side view showing a state where a first fixing portion and a second fixing portion are mounted on a flexible printed board.

A manufacturing method of the first connector 10 is described using FIGS. 9 to 12. First, as shown in FIG. 8, the fixing portion 41 is mounted on the planar flexible printed board 20. The first fixing portion 51 is connected to the back surface 31B of the first constituent portion 31 by reflow solder (solder paste before a heat treatment) such that the first constituent portion 31 is planar. The protrusions 55 are inserted through the holes (not shown) provided in the first constituent portion 31 and the reflow solder is applied. The second fixing portion 52 is connected to the back surface 32B of the second constituent portion 32 by reflow solder such that the second constituent portion 32 is planar. The protrusions 59 are inserted through the holes (not shown) provided in the second constituent portion 32 and the reflow solder is applied.

Subsequently, a reflow process is performed for the planar flexible printed board 20 having the fixing portion 41 mounted thereon. In this way, the first fixing portion 51 is soldered to the back surface 31B of the first constituent portion 31 and the second fixing portion 52 is soldered to the back surface 32B of the second constituent portion 32. Since the first and second fixing portions 51, 52 are separate bodies, the first fixing portion 51 to be planarly fixed to the first constituent portion 31 and the second fixing portion 52 to be planarly fixed to the second constituent portion 32 can be planarly arranged. Thus, the first and second constituent portions 31, 32 are more easily reflow-processed.

Figure 10:
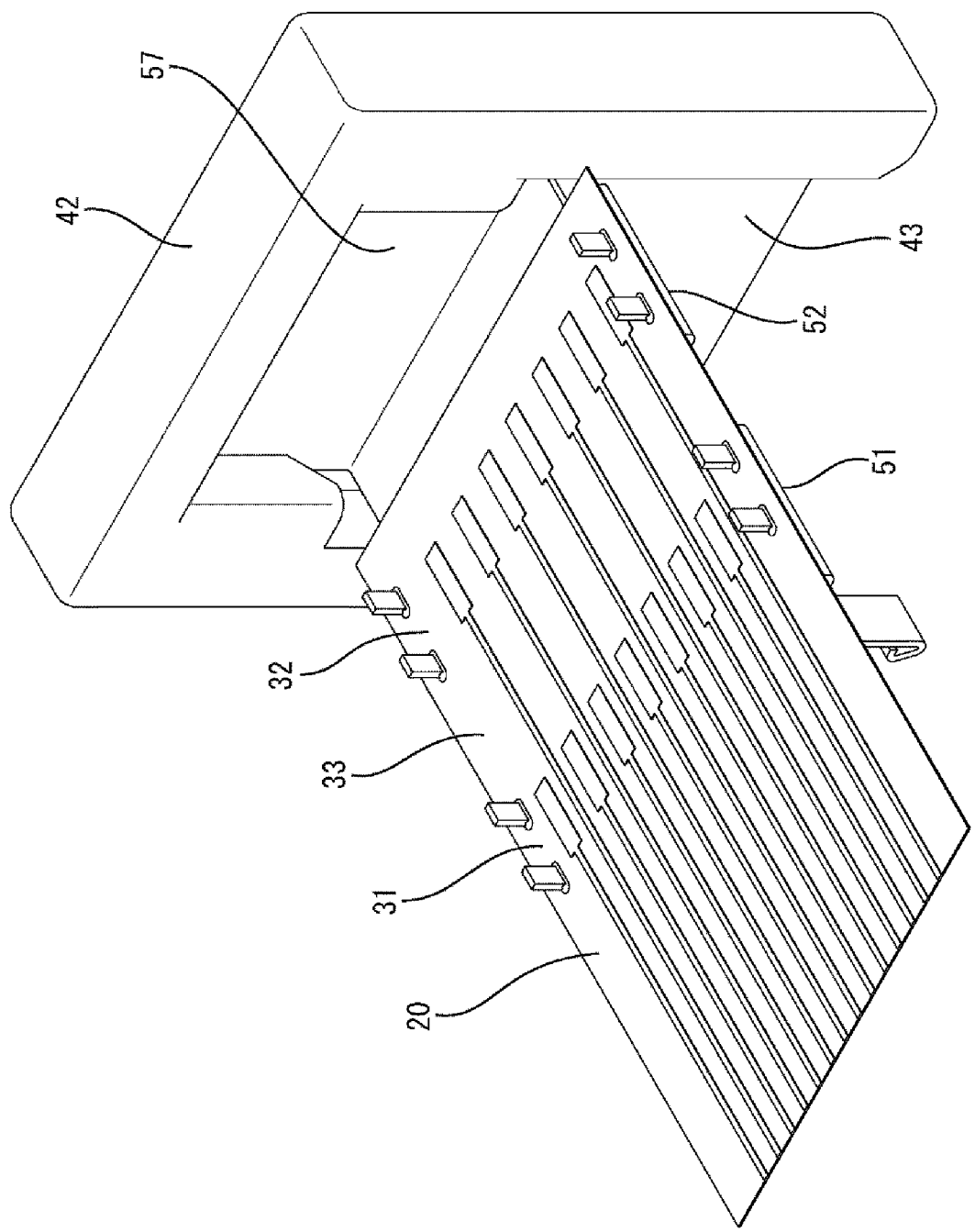
FIG. 10 is a perspective view showing the state where the holding portion is attached to the flexible printed board in the state shown in FIG. 8.

Subsequently, as shown in FIGS. 9 and 10, the second fixing portion 52 is fixed to the holding portion 42. The rear end part of the plate portion 57 of the second fixing portion 52 is fixed to the bottom part of the groove portion 43. For example, the groove portion 43 is provided with a structure for hooking the plate portion 57 or the like.

Subsequently, as shown in FIG. 11, the flexible printed board 20 is folded by bringing the first and second fixing portions 51, 52 closer such that the back surface 31B of the first constituent portion 31 and the back surface 32B of the second constituent portion 32 face each other. The flexible printed board 20 is so folded that the bent portion 33 is convex upward. The plate surface of the plate portion 53 of the first fixing portion 51 and that of the plate portion 57 of the second fixing portion 52 face each other. The folded portions 54 of the first fixing portion 51 and the folded portions 58 of the second fixing portion 52 are in contact in the front-rear direction. The plate portion 53 of the first fixing portion 51 and the plate portion 57 of the second fixing portion 52 are parallel along the vertical direction. The plate surface of the first constituent portion 31 and that of the second constituent portion 32 are parallel along the vertical direction. The hooking portions 56 of the first constituent portion 31 are hooked to the end parts in the lateral direction of the plate portion 57 of the second constituent portion 32. In this way, the facing state of the back surface 31B of the first constituent portion 31 and the back surface 32B of the second constituent portion 32 is maintained. In this way, the first connector is manufactured.

<Assembling of First Connector with Second Connector>

Figure 13:
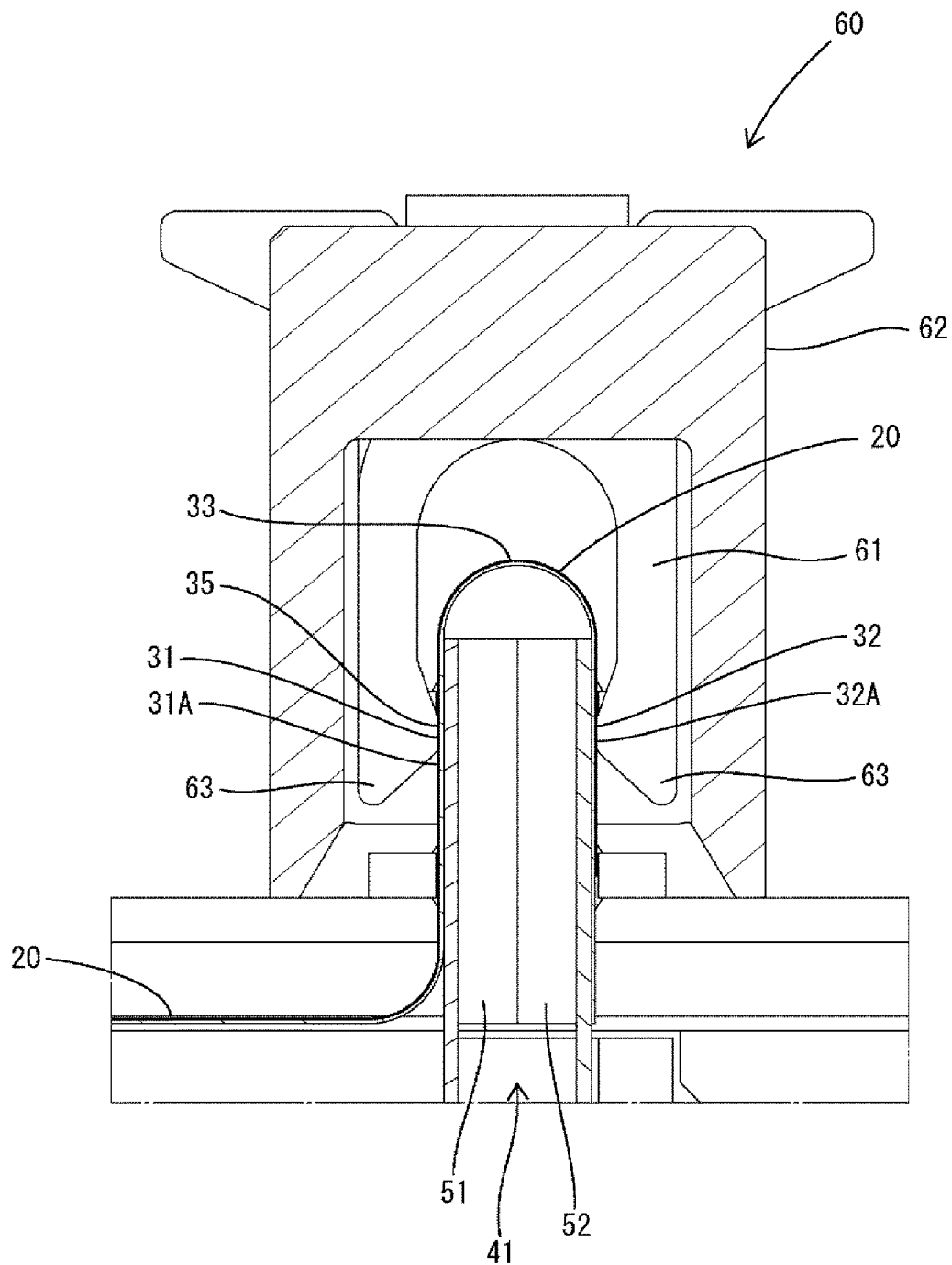
FIG. 13 is a section showing the state where the first connector is assembled with the second connector.

As shown in FIG. 12, the first connector 10 is assembled with the second connector 60. Note that a closing portion 45 for covering the groove portion 43 of the holding portion 42 from above is provided in FIG. 12. As shown in FIG. 13, the folded part (first constituent portion 31, second constituent portion 32 and bent portion 33) of the flexible printed board 20 is inserted into the inside (more specifically, between the pairs of the sandwiching pieces 63) of the case 62. The pairs of sandwiching pieces 63 of the terminal fittings 61 sandwich the first and second constituent portions 31, 32 from both sides in the front-rear direction. Since the first and second constituent portions 31, 32 are planarly fixed to the fixing portion 41, the first and second constituent portions 31, 32 can be smoothly sandwiched by the pairs of sandwiching pieces 63 as compared to a configuration in which the first and second constituent portions 31, 32 have a curved shape or the like. The terminal fitting 61 contacts either one of the first and second contacts 35, 36.

Effects of Embodiment

As described above, in the connection structure for flexible printed board of the present disclosure, the first constituent portion 31 having the plurality of first contacts 35 arrayed along the lateral direction (first direction) provided on the front surface and the second constituent portion 32 having the plurality of second contacts 36 arrayed along the lateral direction (first direction) provided on the front surface are disposed side by side in the front-rear direction (second direction) orthogonal to the lateral direction (first direction). Thus, the size of the flexible printed board 20 in the lateral direction (first direction) can be reduced as compared to a configuration in which as many contacts as the sum of the first and second contacts 35, 36 are arrayed along the lateral direction (first direction). Since the back surface 31B of the first constituent portion 31 and the back surface 32B of the second constituent portion 32 face each other, the size of the flexible printed board 20 in the front-rear direction (second direction) can be reduced as compared to a configuration in which the first and second constituent portions 31, 32 are planar along the front-rear direction (second direction). Since the plurality of first contacts 35 and the plurality of second contacts 36 are arranged in a staggered manner along the lateral direction (first direction), the intervals between the contacts adjacent in the lateral direction (first direction) are set relatively wide and there is little influence of dimensional tolerances.

In the connection structure for flexible printed board of the present disclosure, the supporting portion 40 includes the fixing portion 41 to be planarly fixed to the back surface 31B of the first constituent portion 31 and the back surface 32B of the second constituent portion 32. By this configuration, the first and second constituent portions 31, 32 can be smoothly sandwiched by the terminal fittings 61 of the second connector (mating connector) 60 as compared to a configuration in which the back surface 31B of the first constituent portion 31 or the back surface 32B of the second constituent portion 32 has a curved shape or the like.

In the connection structure for flexible printed board of the present disclosure, the fixing portion 41 includes the first fixing portion 51 to be planarly fixed to the back surface 31B of the first constituent portion 31 and the second fixing portion 52 separate from the first fixing portion 51 and to be planarly fixed to the back surface 32B of the second constituent portion 32. By this configuration, the first fixing portion 51 to be planarly fixed to the back surface 31B of the first constituent portion 31 and the second fixing portion 52 to be planarly fixed to the back surface 32B of the second constituent portion 32 can be arranged on the same two-dimensional plane. Thus, the reflow process can be performed for the planarly arranged first and second fixing portions 51, 52, and the first and second fixing portions 51, 52 are more easily fixed to the flexible printed board 20.

In the connection structure for flexible printed board of the present disclosure, the first fixing portion 51 is fixed to the back surface 31B of the first constituent portion 31 by soldering and the second fixing portion 52 is fixed to the back surface 32B of the second constituent portion 32 by soldering. By this configuration, the back surface 31B of the first constituent portion 31 and the back surface 32B of the second constituent portion 32 can be respectively planarly fixed to the first and second fixing portions 51, 52.

A method for manufacturing a flexible printed board unit of the present disclosure is the manufacturing method of the first connector (flexible printed board unit) 10 including the flexible printed board 20 to be connected to the second connector (mating connector 60) and the supporting portion 40 for supporting the flexible printed board 20. The flexible printed board 20 includes the first constituent portion 31 having the plurality of first contacts 35 arrayed along the lateral direction (predetermined first direction) provided on the surface 31A and the second constituent portion 32 disposed side by side with the first constituent portion 31 in the front-rear direction (second direction) orthogonal to the lateral direction (first direction) and having the plurality of second contacts 36 arrayed along the lateral direction (first direction) provided on the surface 32A. The supporting portion 40 includes the first fixing portion 51 to be fixed to the back surface 31B of the first constituent portion 31 and the second fixing portion 52 separate from the first fixing portion 51 and to be fixed to the back surface 32B of the second constituent portion 36. For the planar flexible printed board 20, the first fixing portion 51 is connected to the back surface 31B of the first constituent portion 31 by reflow solder such that the first constituent portion 31 is planar. The second fixing portion 52 is connected to the back surface 32B of the second constituent portion 32 by reflow solder such that the second constituent portion 32 is planar. After the reflow process, the flexible printed board 20 is folded by bringing the first and second fixing portions 51, 52 closer such that the back surface 31B of the first constituent portion 31 and the back surface 32B of the second constituent portion 32 face each other. By this configuration, the first fixing portion 51 to be planarly fixed to the back surface 31B of the first constituent portion 31 and the second fixing portion 52 to be planarly fixed to the back surface 32B of the second constituent portion 32 can be arranged on the same two-dimensional plane for the planar flexible printed board 20. Thus, the reflow process can be performed for the planarly arranged first and second fixing portions 51, 52, and the first and second fixing portions 51, 52 are more easily fixed to the flexible printed board 20. By bringing the first and second fixing portions 51, 52 closer after the reflow process such that the back surface 31B of the first constituent portion 31 and the back surface 32B of the second constituent portion 32 face each other, the flexible printed board 20 can be easily folded.

Other Embodiments

The present invention is not limited to the above described and illustrated embodiment, but is represented by claims. The present invention is intended to include all changes in the scope of claims and in the meaning and scope of equivalents and also include the following embodiment.

Although the terminal fitting 61 is a tuning fork-shaped plate-like terminal in the above embodiment, the terminal fitting 61 may have another shape. For example, the terminal fitting 61 may be provided with one contact piece (part to be brought into contact with either one of the first and second contacts 35, 36) instead of the pair of sandwiching pieces 63.

LIST OF REFERENCE NUMERALS

10 . . . first connector (flexible printed board unit)
20 . . . flexible printed board
21 . . . wire
22 . . . insulating sheet
31 . . . first constituent portion
31A . . . front surface (upper surface)
31B . . . back surface (lower surface)
32 . . . second constituent portion
32A . . . front surface (upper surface)
32B . . . back surface (lower surface)
33 . . . bent portion
34 . . . body portion
35 . . . first contact
36 . . . second contact
40 . . . supporting portion
41 . . . fixing portion
42 . . . holding portion
43 . . . groove portion
44 . . . slit
45 . . . closing portion
51 . . . first fixing portion
52 . . . second fixing portion
53 . . . plate portion
54 . . . folded portion
55 . . . protrusion
56 . . . hooking portion
57 . . . plate portion
57A . . . extending portion
58 . . . folded portion
59 . . . protrusion
60 . . . second connector (mating connector)
61 . . . terminal fitting
62 . . . case
63 . . . sandwiching piece
64 . . . connecting piece
65 . . . third contact

What is claimed is:

1. A connection structure for flexible printed board in which a flexible printed board is connected to a mating connector, comprising:
the flexible printed board including:
a first constituent portion having a plurality of first contacts arrayed along a predetermined first direction provided on a front surface; and
a second constituent portion disposed side by side with the first constituent portion in a second direction orthogonal to the first direction, the second constituent portion having a plurality of second contacts arrayed along the first direction provided on a front surface; and
a supporting portion for supporting the flexible printed board in a folded state such that a back surface of the first constituent portion and a back surface of the second constituent portion face each other,
the plurality of first contacts and the plurality of second contacts being arranged in a staggered manner along the first direction, and
the mating connector including a plurality of terminal fittings arrayed along the first direction, the terminal fitting sandwiching the first and second constituent portions from both sides in the second direction and contacting either one of the first and second contacts.

2. The connection structure for flexible printed board of claim 1, wherein the supporting portion includes a fixing portion to be planarly fixed to the back surface of the first constituent portion and the back surface of the second constituent portion.

3. The connection structure for flexible printed board of claim 2, wherein the fixing portion includes:
   a first fixing portion to be planarly fixed to the back surface of the first constituent portion; and
   a second fixing portion separate from the first fixing portion and to be planarly fixed to the back surface of the second constituent portion.

4. The connection structure for flexible printed board of claim 3, wherein:
   the first fixing portion is fixed to the back surface of the first constituent portion by soldering, and
   the second fixing portion is fixed to the back surface of the second constituent portion by soldering.

5. A method for manufacturing a flexible printed board unit including a flexible printed board to be connected to a mating connector and a supporting portion for supporting the flexible printed board,
   the flexible printed board including:
      a first constituent portion having a plurality of first contacts arrayed along a predetermined first direction provided on a front surface; and
      a second constituent portion disposed side by side with the first constituent portion in a second direction orthogonal to the first direction, the second constituent portion having a plurality of second contacts arrayed along the first direction provided on a front surface; the plurality of first contacts and the plurality of second contacts being arranged in a staggered manner along the first direction;
   the supporting portion including:
      a first fixing portion to be planarly fixed to a back surface of the first constituent portion; and
      a second fixing portion separate from the first fixing portion and to be planarly fixed to a back surface of the second constituent portion,
   the method comprising:
   connecting the first fixing portion to the back surface of the first constituent portion by reflow solder such that the first constituent portion is planar and connecting the second fixing portion to the back surface of the second constituent portion by reflow solder such that the second constituent portion is planar for the planar flexible printed board; and
   folding the flexible printed board after a reflow process by bringing the first and second fixing portions closer such that the back surface of the first constituent portion and the back surface of the second constituent portion face each other.

* * * * *